United States Patent
Liu et al.

(10) Patent No.: US 8,119,533 B2
(45) Date of Patent: *Feb. 21, 2012

(54) PATTERN FORMATION IN SEMICONDUCTOR FABRICATION

(75) Inventors: George Liu, Shin-Chu (TW); Kuei Shun Chen, Hsin-Chu (TW); Vencent Chang, Hsinchu (TW); Shang-Wen Chang, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 94 days.

This patent is subject to a terminal disclaimer.

(21) Appl. No.: 12/650,719

(22) Filed: Dec. 31, 2009

(65) Prior Publication Data

US 2010/0109054 A1    May 6, 2010

Related U.S. Application Data

(63) Continuation of application No. 11/841,485, filed on Aug. 20, 2007, now Pat. No. 7,648,918.

(51) Int. Cl.
*H01L 21/467* (2006.01)
*H01L 23/58* (2006.01)

(52) U.S. Cl. ........ 438/734; 438/781; 438/952; 257/642; 257/E21.314

(58) Field of Classification Search .................... 438/952
See application file for complete search history.

(56) References Cited

U.S. PATENT DOCUMENTS

| 7,648,918 B2 * | 1/2010 | Liu et al. .................... 438/734 |
| 2006/0189146 A1 | 8/2006 | Oweyang et al. |
| 2007/0105043 A1 | 5/2007 | Elian et al. |

FOREIGN PATENT DOCUMENTS

JP     2002-207299     7/2002

OTHER PUBLICATIONS

Uematsu, M., "Method of Manufactured Semiconductor and Semiconductor", English Translation of Detailed Description for JP 2002-207299 A, JPO, Jul. 26, 2002.

* cited by examiner

*Primary Examiner* — Stephen W Smoot
(74) *Attorney, Agent, or Firm* — Haynes and Boone, LLP (57) ABSTRACT

Provided is a semiconductor device. The device includes a substrate having a photo acid generator (PAG) layer on the substrate. The PAG layer is exposed to radiation. A photoresist layer is formed on the exposed PAG layer. The exposed PAG layer generates an acid. The acid decomposes a portion of the formed photoresist layer. In one embodiment, the PAG layer includes organic BARC. The decomposed portion of the photoresist layer may be used as a masking element.

20 Claims, 7 Drawing Sheets

PATTERN FORMATION IN SEMICONDUCTOR FABRICATION

This application is a Continuation of U.S. patent application Ser. No. 11/841,485, filed Aug. 20, 2007, now U.S. Pat. No. 7,648,918, which is hereby incorporated by reference in its entirety.

BACKGROUND

The present disclosure relates generally to semiconductor fabrication and, more particularly, to a method of patterning a layer of a semiconductor device, including the fabrication of a masking element for such patterning.

The fabrication of semiconductor devices requires the formation of numerous features on a substrate such as, interconnect lines and other conductive layers, gate structures, doped regions, isolation regions, and/or other features known in the art. Formation of features such as these often requires a plurality of photolithography processes to pattern the feature. During a photolithography process, a masking element is formed on a substrate, the substrate including one or more layers of material. A masking element, typically a sacrificial patterned layer of photoresist, allows a portion of the substrate to be blocked, while exposing other portions. This allows for selective processing of the substrate, such as etching, ion implantation, and/or other processes known in the art. Forming a typical masking element requires coating the wafer with photoresist, exposing the photoresist to a soft bake, exposing the photoresist to a pattern, developing the photoresist, and exposing the photoresist to a hard bake.

One disadvantage to conventional semiconductor fabrication processes is the numerous steps required for fabrication of a feature on the substrate. For example, a process for the formation of a polycrystalline silicon (polysilicon) gate electrode may be required. In order to pattern a layer of polysilicon deposited on a substrate to form a gate electrode, a first masking element is formed to provide a pattern for substantially linear features. The polysilicon layer is then etched according to this pattern to form substantially linear features. The first masking element is removed from the substrate. A second masking element may then be then formed to provide a pattern for gaps in the previously formed substantially linear features. The polysilicon features are then etched according to this second pattern. Thus, two photolithography processes and two etching processes are required. The numerous steps required add costs to the fabrication including, for example, increased complexity of the processing and increased cycle time.

As such, an improved method of patterning a feature of a semiconductor device is desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to semiconductor devices and more particularly, to a method of patterning a feature of a semiconductor device including the fabrication of a masking element. It is understood, however, that specific embodiments are provided as examples to teach the broader inventive concept, and one of ordinary skill in the art can easily apply the teaching of the present disclosure to other methods or devices. In addition, it is understood that the methods and apparatus discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings. Moreover, the formation of a first feature over, on, adjacent, abutting, or coupled to a second feature in the description that follows may include embodiments in which the first and second features are formed in direct contact, and may also include embodiments in which additional features may be formed interposing the first and second features, such that the first and second features may not be in direct contact. Also, the formation of a feature on a substrate may include embodiments where features are formed above the surface of the substrate, directly on the surface of the substrate, and/or extending below the surface of the substrate (such as, trenches). A substrate may include a semiconductor wafer and one or more features formed on the wafer such as conductive layers, insulating layers, isolation regions, doped regions, and/or other features known in the art.

Figure 1:
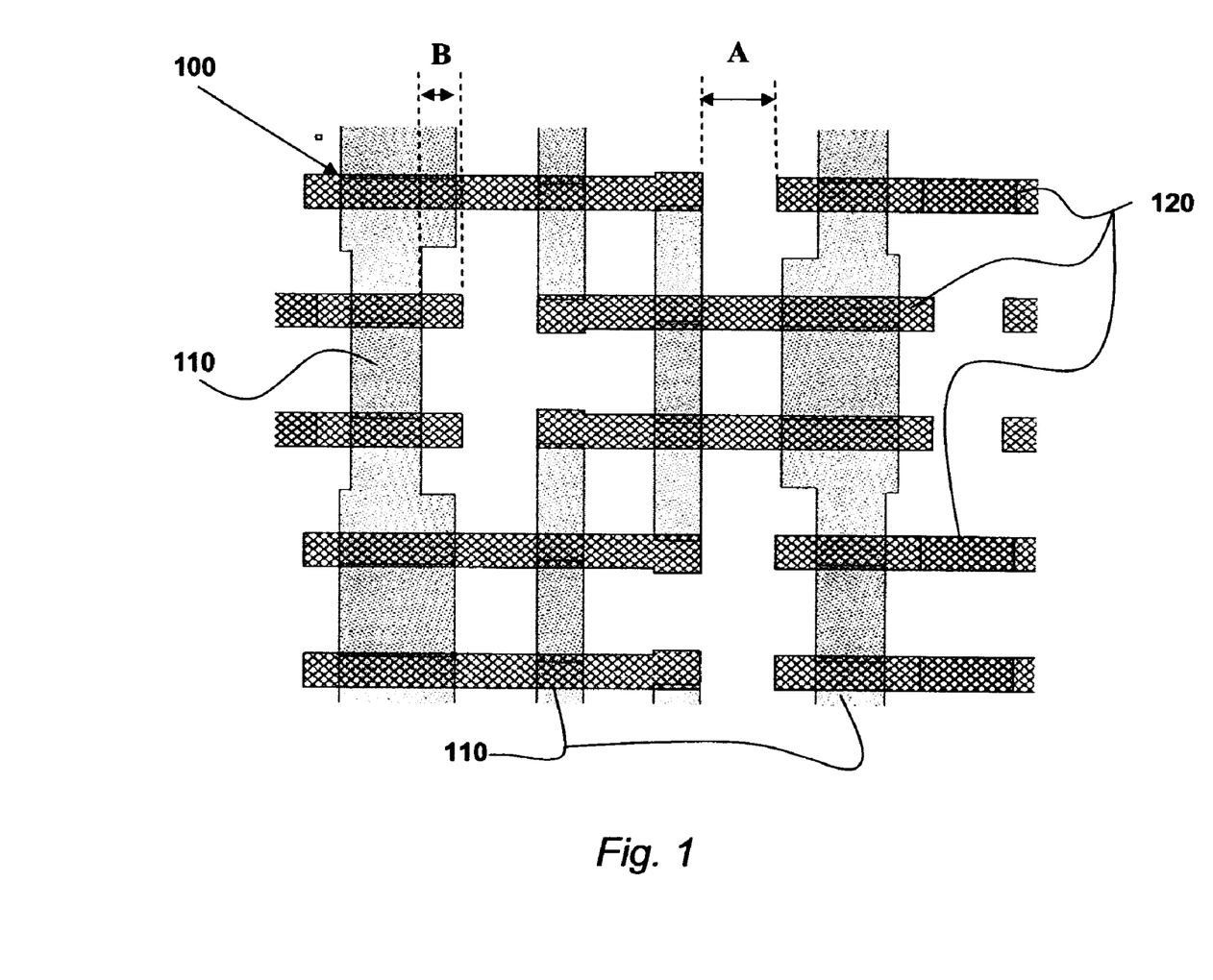
FIG. 1 is a top view of a layout-design of a semiconductor device.

Referring to FIG. 1, illustrated is a top-view of a layout 100 of a semiconductor device. The semiconductor device of the layout 100 may include a plurality of transistors, memory elements, diodes, photodiodes, and/or other features known in the art. The layout 100 includes a plurality of active regions 110 and a plurality of gate electrode features 120. In an embodiment, the active regions 110 may be regions formed on an epitaxial layer of the substrate. The active regions 110 may comprise one or more doped regions such as a source region and/or a drain region of a transistor. The doping may be accomplished using conventional processes such as ion implantation or diffusion. The doping may include doping with a positive-type dopant, such as boron or other suitable material known in the art, or a negative-type dopant, such as phosphorus, arsenic, antimony, or other suitable material known in the art.

The gate electrode features 120 are of a conductive material such as polysilicon. Other examples of conductive materials suitable for use in the gate electrode features 120 include metals such as, Cu, W, Ti, Ta, TiN, TaN, NiSi, CoSi, and/or combinations thereof. The gate electrode features 120 are illustrated as linear features (e.g. "lines"). However, the illustration and discussion simplify the gate electrode feature as a typical feature may not be linear.

In one embodiment, the formation of the gate electrode features 120 requires multiple photolithography and multiple etching steps. For example, a first masking element, typically of photoresist, may be formed on a layer of deposited polysilicon. The first masking element includes a pattern of plurality of contiguous linear features. The polysilicon layer is then patterned, by etching the polysilicon, to form a plurality of such contiguous linear features using the masking element. The first masking element is then removed. A second masking element, also typically of photoresist, may then be formed on the patterned polysilicon. The second masking element includes a pattern for fabricating gaps in the contiguous linear features. The polysilicon linear features are then etched to form these gaps using the second masking element, the gaps may be substantially similar to a gap A, illustrated FIG. 1. Thus, this embodiment of the process requires two full photolithography processes (e.g. fabrication each of the first masking element and the second masking element) and two etching processes (e.g. etching a first pattern based on the first masking element and to separately etch a second pattern based on the second masking element) to pattern a single layer. This process may have disadvantages including, for example, process complexity, cycle time, and/or other costs known in the art.

However, the gap A as well as the overlap of the polysilicon gate feature 120 and the active region 110, illustrated by dimension B, may be critical parameters to the functioning of a semiconductor device. For example, a layout including the dimension B of less than five (5) nanometers may cause device failure. However, the expansion of the gap A, desired for device performance, shortens the dimension B. Therefore, there is a need for patterning of the gate electrode feature 120 that maintains the gap A as well as provides a sufficient dimension B. The layout 100, and the formation of gate electrode feature 120, is but one example of a semiconductor device and/or feature for which the method 200, described below may be used. The layout 100 is provided herein as example only and is not intended to be limiting in any manner.

Figure 2:
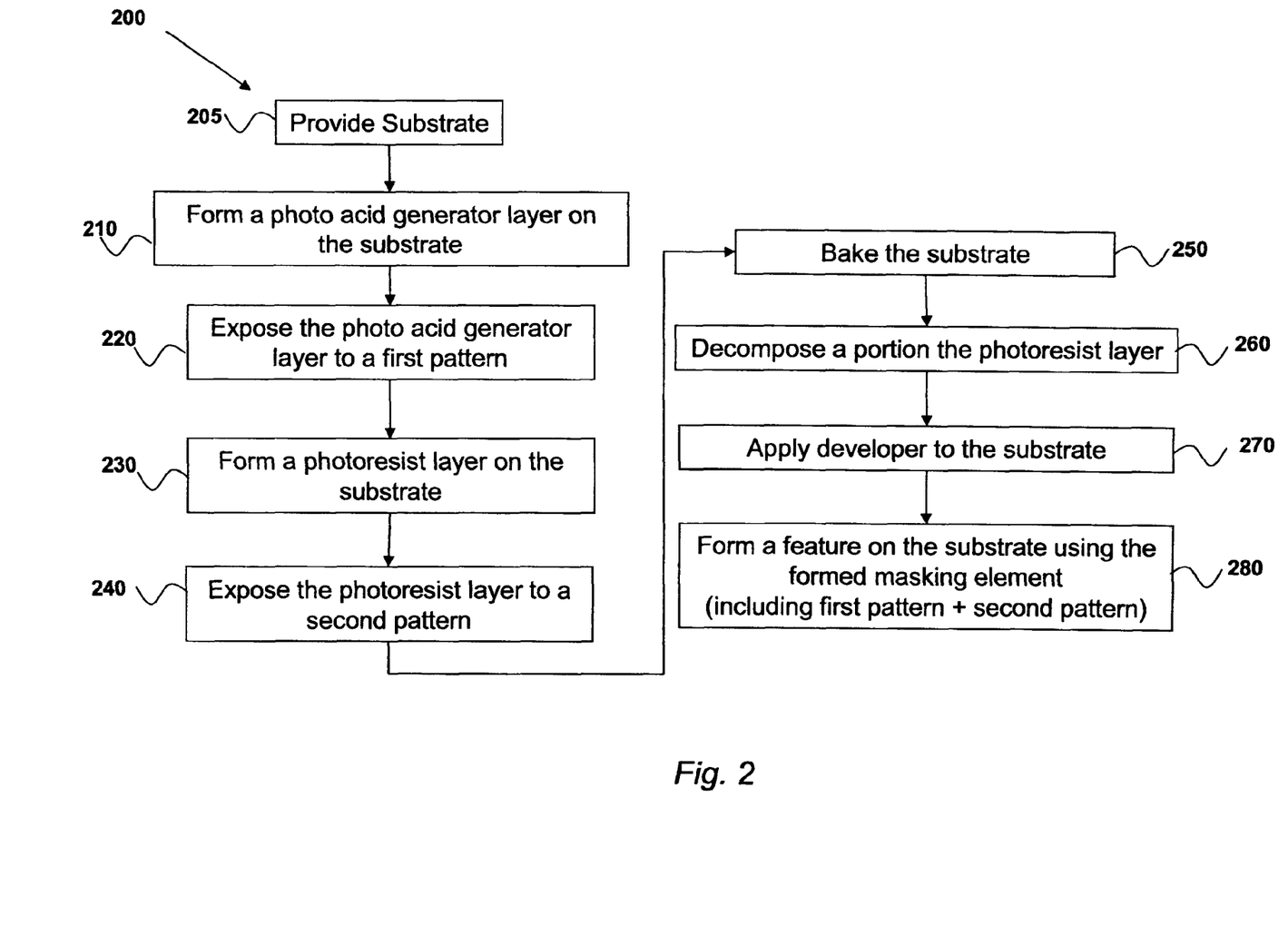
FIG. 2 is a flow-chart illustrating a method of fabricating a semiconductor device.
Figure 3A:
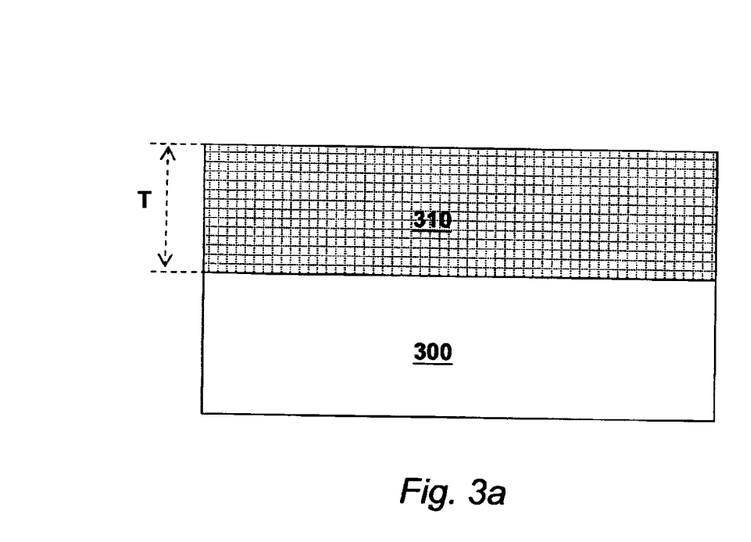
FIGS. 3a, 4a, 5a, 6a, and 7a are cross-sectional views of a substrate illustrating an embodiment of the method of FIG. 2.
Figure 3B:
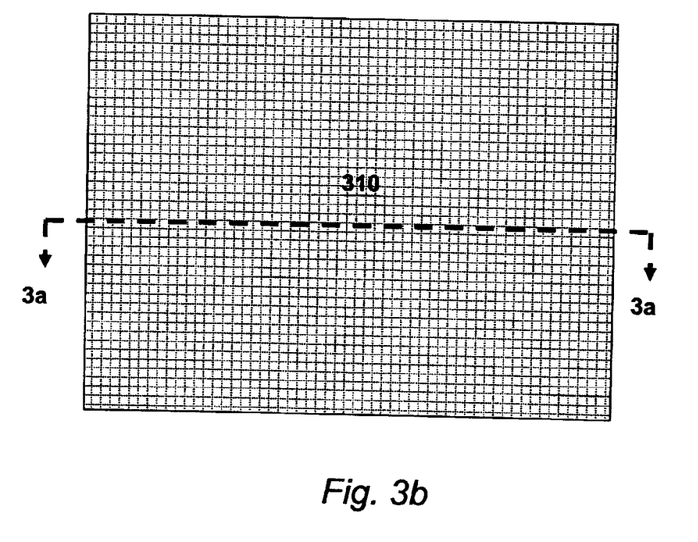
FIGS. 3b, 4b, 5b, 6b, and 7b are top-views of a substrate illustrating an embodiment of the method of FIG. 2, and correspond to the cross-sectional views of FIGS. 3a, 4a, 5a, 6a, and 7a respectively.
Figure 4A:
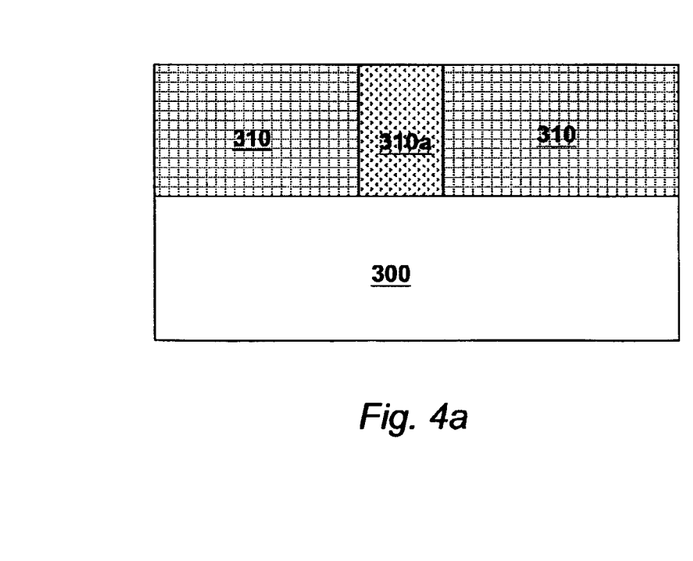
Figure 4B:
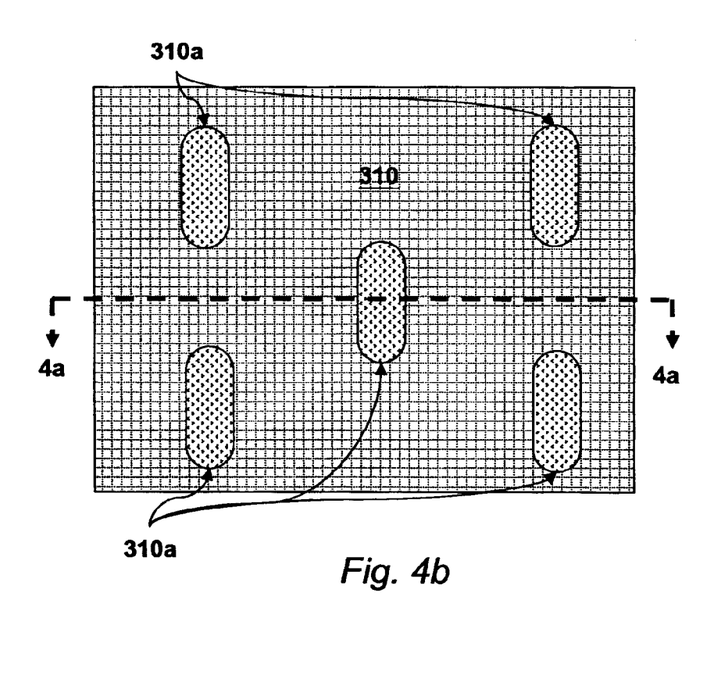

Referring now to FIG. 2 illustrated is a method 200 for fabricating a feature of a semiconductor device. FIGS. 3a, 4a, 5a, 6a, and 7a illustrate an embodiment of the method 200 through incremental modifications of a substrate 300 corresponding to the method 200 as shown in cross-section. FIGS. 3b, 4b, 5b, 6b, and 7b illustrate the corresponding top-views of the substrate 300.

The method 200 begins with step 205 where a substrate is provided. In the present embodiment, the substrate is silicon in a crystalline structure. In alternative embodiments, the substrate may include other elementary semiconductors such as germanium, or may include a compound semiconductor such as, silicon carbide, gallium arsenide, indium arsenide, or indium phosphide. The substrate may include a silicon on insulator (SOI) substrate and/or other isolation features. The substrate may further comprise one or more other features formed on the substrate including insulating layers, conductive layers, doped regions, epitaxial regions, isolation structures, transistor features including gate structures, and/or other features known in the art. In an embodiment, the substrate 300 includes active regions similar to the active regions 110, described above with reference to FIG. 1. In an embodiment, the substrate 300 includes a layer of material suitable for formation of a gate electrode, such as the gate electrode features 120, described above with reference to FIG. 1. An example of a material suitable for gate electrode formation is polysilicon, though other conductive materials are possible. One or more layers, including for example, a polysilicon layer, may be formed on the substrate using processes known in the art such as, chemical vapor deposition (CVD), oxidation, physical vapor deposition (PVD), plasma enhanced CVD (PECVD), atmospheric pressure CVD (APCVD), atomic layer deposition (ALD), low pressure CVD (LPCVD), high density plasma CVD (HDPCVD), atomic layer CVD (ALCVD), and/or other processes known in the art. Referring to the example of FIG. 3a, the substrate 300 is provided. As described above, the substrate 300 may include a plurality of layers of conductive material, insulating material, doped regions, and/or other features known in the art. In an embodiment, a layer of conducting material, such as polysilicon, is formed on the top surface of the substrate 300.

The method 200 then proceeds to step 210 where a photo acid generator layer is formed on the substrate. The photo acid generator (PAG) layer may also be an acid retaining film. The PAG layer includes a photosensitive material such that when the material is exposed to radiation, the material generates an acid. The radiation may include, for example, visible light, ultraviolet (UV) radiation, deep ultraviolet (DUV), extreme ultraviolet (EUV), x-ray, ion beam, and/or radiation from other sources known in the art. The photo acid generator (PAG) layer may include an anti-reflective coating (ARC), including for example, a bottom anti-reflective coating (BARC). In an embodiment, the PAG layer includes an organic BARC layer. The PAG layer may be formed by spin-on coating, and/or other deposition processes known in the art such as chemical vapor deposition (CVD). Referring to the example of FIGS. 3a and 3b, the photo acid generator (PAG) layer 310 is formed. The PAG layer 310 may include a photosensitive, organic BARC material. The PAG layer 310 includes a thickness T. The thickness T may be between approximately 30 nanometers and 100 nanometers.

The method 200 then proceeds to step 220 where the PAG layer is exposed to radiation during an exposure process, that is, the PAG layer is patterned. (Pattern or patterning as used herein provides simply for the exposure of a layer to a pattern, and is not meant to be encompassing of the entire lithography process). The PAG layer is exposed by irradiating the PAG layer through a photomask having a first pattern. A photomask is a mask structure used in conventional photolithography processes to block a layer's exposure to radiation in selected areas. The radiation may be UV, deep ultraviolet (DUV), extreme ultraviolet (EUV), electron beam, ion beam lithography, visible light, and/or radiation from other sources known in the art. In an embodiment, the pattern provided is such that it defines gaps in a gate electrode feature, such as the gap A in the gate electrode features 120, described above with reference to FIG. 1. The PAG layer composition may be such that the irradiated portions of the PAG layer generate an acid. The acid may be generated at the irradiation, or generated by the irradiated portions of the PAG layer after exposure to an elevated temperature, such as is described below with reference to step 250. Referring the example of FIGS. 4a and 4b, the PAG layer is patterned such that an exposed PAG layer 310a is formed. The PAG layer 310 illustrates non-irradiated portions of the PAG layer. The exposed PAG layer 310a may generate an acid and/or may be capable of generating an acid upon exposure to elevated temperatures. It should be noted that the patterned PAG layer may not be used as a masking element at this step.

The method 200 then continues to step 230 where a photoresist (or resist) layer is formed on the substrate, and in particular on the PAG layer, formed above with reference to steps 210 and 220. The photoresist layer may include positive type or negative type resist (e.g. photosensitive liquid-plastic film) as known in the art. The photoresist may be applied by spin-on coating and/or other deposition processes known in the art. In an embodiment, the photoresist layer is formed directly on the PAG layer. Though described herein a photoresist, in alternative embodiments, the layer may include any acid reacting material. Referring to the example of FIGS. 5a and 5b, a photoresist layer 500 is formed on the substrate 300.

Figure 5A:
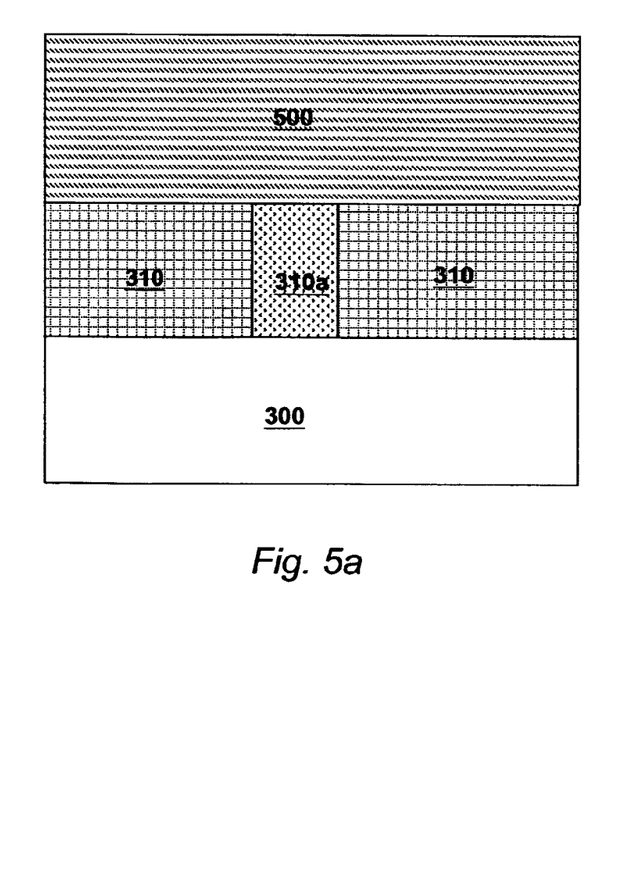
Figure 5B:
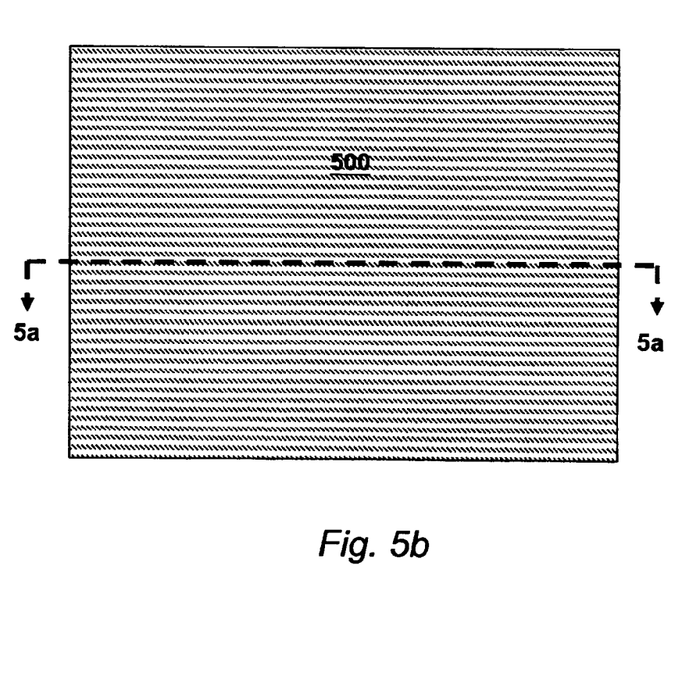

The photoresist layer 500 is formed directly on the PAG layer 310 and the exposed PAG layer 310a.

The method 200 then continues to step 240 where the photoresist layer, formed above with reference to step 230, is exposed to radiation during an exposure process, that is, the photoresist layer is patterned. The photoresist layer is exposed by passing radiation through a photomask having a second pattern, which may be distinct from the first pattern discussed above with reference to step 220. The radiation may be UV, deep ultraviolet (DUV), extreme ultraviolet (EUV), visible light, and/or radiation from other sources known in the art. In an embodiment, the second pattern provided in the photoresist layer may be such that it defines contiguous linear features, similar to as illustrated by the gate electrode 120 without the gap A, described above with reference to FIG. 1. Referring to the example of FIG. 6b, the photoresist layer 500 may be patterned such that patterned resist 500a is formed. In an embodiment, the photoresist layer 500 includes positive type photoresist and the patterned resist 500a is unexposed resist (e.g. insoluble to developer). In another embodiment, the photoresist layer 500 includes a negative type photoresist and the patterned resist 500a is irradiated resist (e.g. insoluble to developer). The patterned resist 500a includes a plurality of contiguous linear features, such as may be used to form a gate electrode structure, such as the gate electrode features 120 illustrated above with reference to FIG. 1. In alternative embodiments, the process used provide a second pattern on the photoresist layer, such as photoresist layer 500 and the patterned resist 500a, may include electron-beam writing, ion-beam writing, mask-less lithography, and/or molecular imprint.

The method 200 then proceeds to steps 250 where the substrate is baked. In an embodiment, step 250 includes a soft bake process (also known as post-exposure bake process). The bake process may also allow, for example, for the exposed photoresist polymers to cleave. In alternative embodiments, the step 250 may include subjecting the substrate to an elevated temperature, including for example a bake process that is a separate process from the conventional soft bake process. For example, in one embodiment, a bake may occur prior to the exposure of the photoresist in step 240. In an embodiment, a bake includes exposing the substrate to a temperature less than 100 degrees Celsius. However, various temperatures and bake times may be utilized as the temperature and/or time of the process may be dependent upon the PAG layer and/or photoresist layer composition.

Figure 6A:
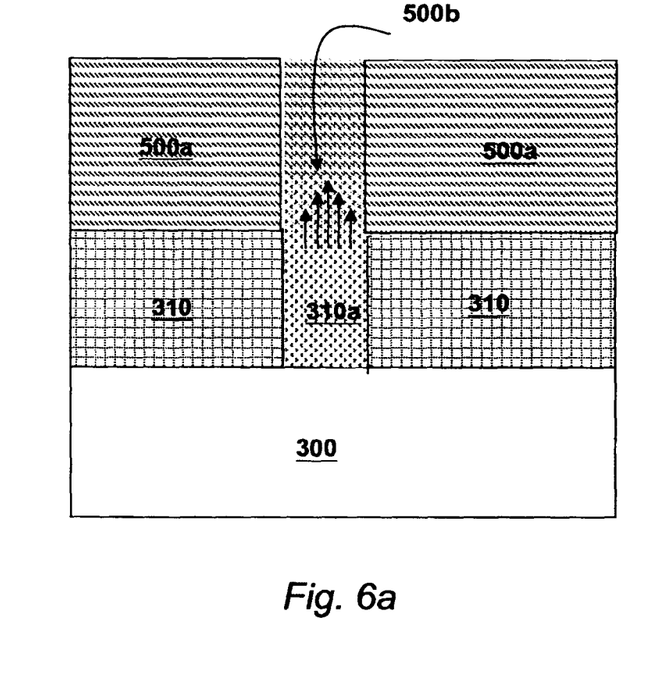
Figure 6B:
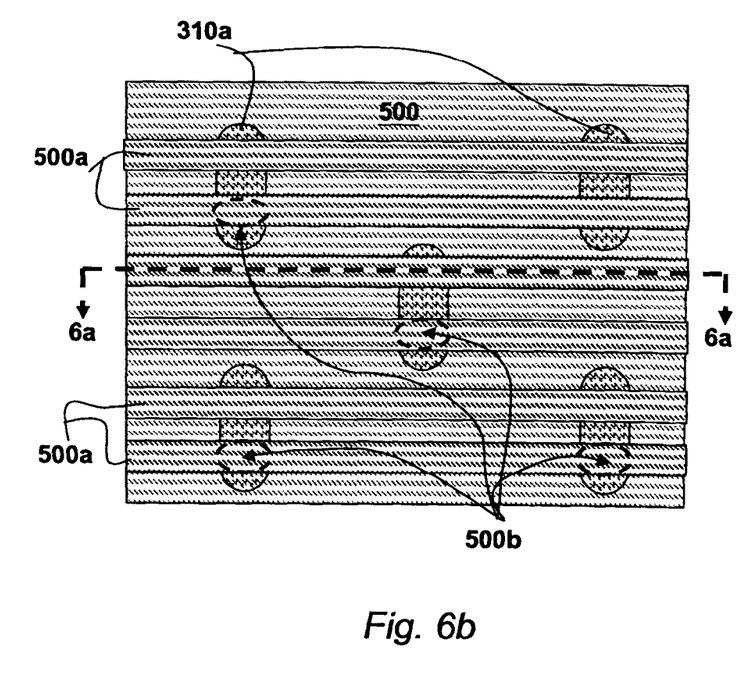
Figure 7A:
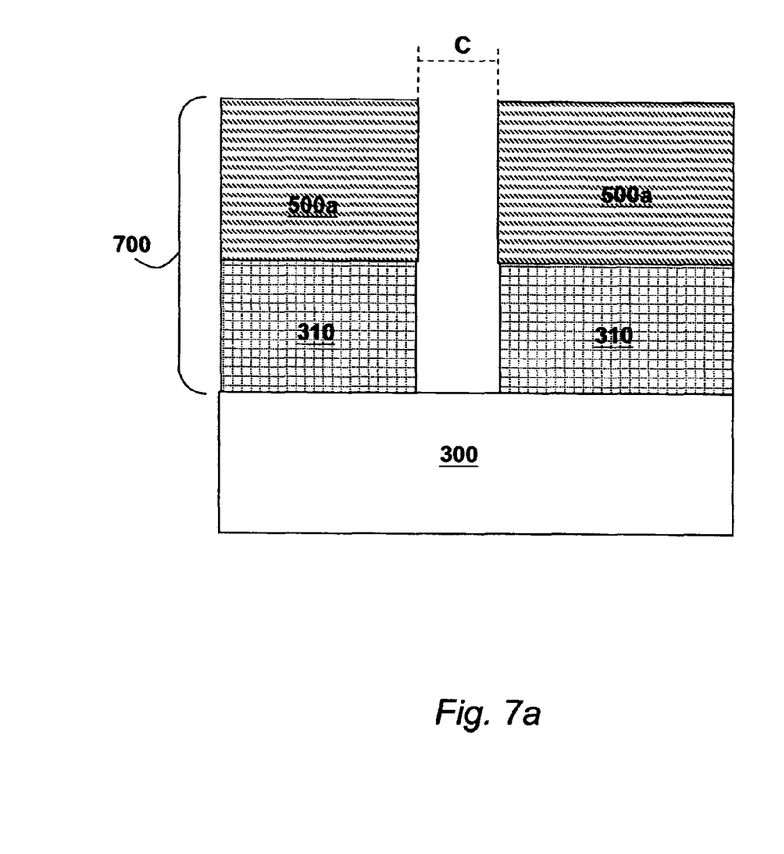
Figure 7B:
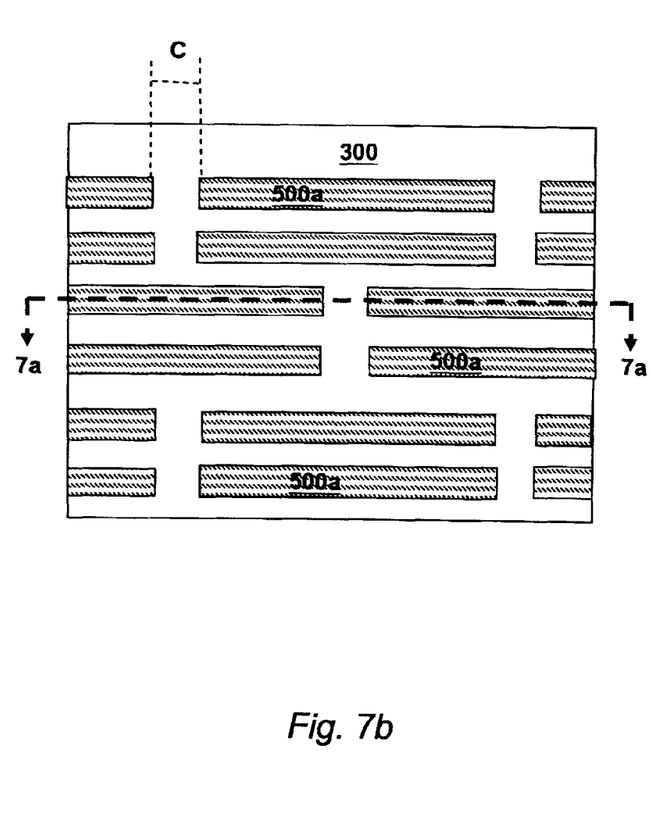

The bake process of step 250 may provide for the substantially simultaneous occurrence of step 260 of the method 200, in that the bake process may stimulate the exposed portions of the PAG layer, described above with reference to step 220, to generate an acid. The bake process may also drive flow of such acid to and through the photoresist layer. The acid may decompose the photoresist with which it comes in contact with, the photoresist being an acid reacting material. As only the exposed PAG layer produces acid, the photoresist is decomposed in a manner such that the first pattern (e.g. the pattern exposed on the PAG layer) is formed on the photoresist layer. Referring to the example of FIGS. 6a and 6b, the overlying photoresist is decomposed by the acid generated by the exposed PAG layer 310a, the acid illustrated as upward pointing arrows from the exposed PAG layer 310a. The decomposed photoresist layer (including that resist in process of decomposing) is referenced as decomposed photoresist 500b. In an embodiment, a portion of the acid generated by the exposed PAG layer 310a may also flow into the PAG layer 310 (e.g. unexposed PAG). The acid may or may not decompose the unexposed PAG layer 310. It should be noted that FIG. 6b illustrates the exposed PAG layer 310a for ease of understanding and so as to clearly illustrate the formation of a pattern, however, the layer of photoresist 500 that was not patterned, e.g. the resist that will be removed by developer as described below in reference to step 270, may be overlying the PAG layer 310a.

The method 200 then proceeds to step 270 where a developer solution is applied to the substrate during the development process. The developer may be an aqueous solution known in the art. In an embodiment, the developer solution includes tetra-methyl ammonium hydroxide (TMAH). The developer may be applied to the surface of the photoresist in the form of a puddle. The developer may remove desired portions of the photoresist layer, leaving only the patterned resist. For example, the developer may remove the exposed photoresist in the case of positive resist or unexposed resist in the case of negative resist. The PAG layer may also be soluble in the developer. As such, the developer may remove the portions of the PAG layer that are not underlying (e.g. masked by) the patterned photoresist. The developer may also remove the decomposed photoresist and/or the exposed PAG layer underlying the decomposed resist. After the developer has removed the unwanted layers, a de-ionized (DI) water rinse may be applied to the substrate, for example, to remove the dissolved polymers of the photoresist. The substrate may then be sent to a spin dry process.

After removal of portions of the photoresist and PAG layer, remaining on the substrate is a masking element including the patterned photoresist layer. The masking element may also include portions of the PAG layer underlying the patterned photoresist layer. The masking element includes a pattern that comprises the combination of the first pattern and the second pattern. The first pattern was formed in step 220 initially in the PAG layer and formed in the photoresist layer due to the decomposition of the photoresist layer by the acid, as described above with reference to step 260. The second pattern was formed in step 240, also described above, for example, through exposure of the photoresist layer. In an embodiment, the masking element includes a pattern providing for linear features including gaps, such as illustrated by the gate electrode features 120 including the gap A, described above with reference to FIG. 1. Referring to the example of FIGS. 7a and 7b, a developer is applied to the substrate 300 removing the photoresist 500. The patterned resist 500a remains on the substrate. The developer also removes the decomposed resist 500b, illustrated in FIGS. 6a and 6b. The developer also removes the PAG layer 310 and the PAG layer 310a that are not masked (e.g. not covered) by the photoresist pattern 500a, also illustrated in FIGS. 6a and 6b. Thus, the masking element 700 is formed on the substrate. The masking element 700 includes the photoresist lines 500a and a gap C between such lines, which may be similar to the gap A, described above with reference to FIG. 1.

Thus formed is a masking element by two photolithography processes, e.g. two exposure processes on two different material layers, the exposure processes using two distinct photomasks having distinct patterns, but providing for one masking element. The substrate including the formed masking element may be hard baked to harden and strengthen the masking element for ease of further processing.

The method 200 then proceeds to step 280 where a feature may be formed (e.g. patterned) on the substrate using the masking element. Thus, the method 200 allows for the formation of a patterned feature that includes the combination of a first pattern and a second pattern on a substrate in a single process. Thus, a layer of a substrate may be patterned, e.g. etched, according to the first pattern and second pattern in a single process. Features formed may include, for example, gate structures including gate electrodes, conductive features, isolation features, doped regions, and/or other features or portions of features known in the art. The masking element may be used for an anisotropic etch and/or isotropic etch of the substrate. In an embodiment, a layer of polysilicon formed on a substrate is etched using a reactive ion etch (RIE) including chlorine or fluorine gas using the masking element to provide appropriate patterning of the polysilicon layer. Referring to the example of FIGS. 7a and 7b, in an embodiment, the substrate 300 may be etched using the masking element 700. In an embodiment, a layer of polysilicon on the substrate 300 may be etched using the masking element 700 such that the polysilicon is removed from the substrate 300 except where the layer is protected (e.g. masked) by the masking element 700. For example, the substrate may be etched in the area defined by the width C where the photoresist has been removed due to the decomposition of the resist such as described above with reference to the decomposed resist 500b in FIGS. 6a and 6b. Thus, a grouping of linear features including a gap may be formed of the polysilicon layer. In an embodiment, these features may be the gate electrodes of a semiconductor device formed on the substrate 300.

The patterning of various features may use the method 200. A feature including a gate structure may include the formation of a gate electrode as described above and/or an underlying gate dielectric layer. The gate dielectric layer may include a dielectric material such as, silicon oxide, silicon nitride, silicon oxy-nitride, dielectric with a high dielectric constant (high k), and/or combinations thereof. Examples of high k materials include hafnium oxide, zirconium oxide, aluminum oxide, hafnium dioxide-alumina ($HfO_2$—$Al_2O_3$) alloy, or combinations thereof. The gate electrode layer includes conductive material. In an embodiment, the gate electrode includes polysilicon. In other embodiments, the gate may be a metal gate with the gate electrode including a metal composition. Examples of suitable metals for forming the gate electrode include Cu, W, Ti, Ta, TiN, TaN, NiSi, CoSi, and/or combinations thereof. The gate electrode and/or gate dielectric may be formed by conventional processes known in the art such as, physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), and/or other deposition processes known in the art followed by patterning of the layer such as described in the method 200. The patterned layer may be etched using a wet etch, dry etch, RIE, and/or other etching processes known in the art.

A feature including a conductive feature may include formation of an interconnect line and/or a contact via. The formed interconnect line may comprise copper, aluminum, tungsten, tantalum, titanium, nickel, cobalt, metal silicide, metal nitride, poly silicon, and/or other materials possibly including one or more refractory layers or linings, and may be formed by chemical vapor deposition (CVD), physical vapor deposition (PVD), atomic layer deposition (ALD), plating, and/or other conventional processes. The patterning of such a line may include the method 200. A feature including a contact via may include a via etched on the substrate, in particular through one or more layers such as insulating layers formed on the substrate. The via may then be filled with conducting material such as, copper, aluminum, tungsten, tantalum, titanium, nickel, cobalt, metal silicide, metal nitride, polysilicon, and/or other materials possibly including one or more refractory layers or linings. The patterning of such a via may include the method 200. An isolation feature including an STI structure may include a trench that is subsequently filled with an insulating material. The STI structures may be formed by etching apertures in the substrate using conventional processes such as reactive ion etch (RIE). The apertures may then be filled with an insulator material, such as an oxide. The patterning of the apertures for STI structures may include the method 200. The above described features are exemplary only and not intended to be limited. One skilled in the art will recognize a plurality of additional features for which the method 200 may be utilized.

The method 200 may continue to include additional steps such as to remove (e.g. strip) the masking element from the substrate. The masking element may be removed by a plasma oxygen ashing. The method 200 may then continue to subsequent processes including, for example, cleaning processes, forming additional layers, and subsequent photolithography patterning.

Thus, the method 200 provides for use of two photolithography processes (e.g. two exposure processes using two photomasks) to form a single masking element. The masking element may be formed by creating a pattern through decomposition of a layer that is acid reacting. The decomposition of a layer and may be brought about by an acid of an underlying acid-generating material layer. The masking element may further include a pattern such as is formed by photolithographic processes such as exposure of a photosensitive layer to radiation and development of the layer. Thus, two patterns may be formed on one masking element (e.g. one masking layer) allowing for both patterns to be formed on the substrate in a single process step. As such, a process step, such as an etch, may be removed from the process.

Thus, provided is a method of fabricating a semiconductor device. The method includes providing a substrate, forming a photo acid generator (PAG) layer on the substrate, exposing the PAG layer, and forming a photoresist layer on the exposed PAG layer. The exposed PAG layer generates an acid. The acid decomposes a portion of the formed photoresist layer. In one embodiment, the PAG layer includes organic BARC.

In another embodiment, a method of fabricating a semiconductor device is provided. The method includes forming an anti-reflective coating (ARC) layer a substrate and exposing the ARC layer. The exposed ARC layer provides a first pattern in the ARC layer. The exposed ARC layer generates an acid. A photoresist layer is formed on the ARC layer. The photoresist layer is decomposed using the generated acid. Thus, the first pattern is formed in the photoresist layer. The photoresist layer is exposed to a second pattern, thereby providing the second pattern in the photoresist layer.

Also provided is a method of forming a masking element for semiconductor device fabrication. The method includes using a photo acid generating film to decompose an overlying film wherein decomposition provides for patterning of the overlying film.

What is claimed is:

1. A semiconductor device comprising:
    a substrate;
    a photo acid generator (PAG) layer formed on the substrate, the PAG layer exposed to radiation, wherein the exposed PAG layer generates an acid;
    a photoresist layer formed on the exposed PAG layer, wherein a portion of the formed photoresist layer is decomposed using the acid, and wherein the decomposing forms a first pattern in the photoresist layer; and
    a second pattern in the photoresist layer formed by exposing the formed photoresist layer to radiation.

2. The device of claim 1, wherein the PAG layer comprises a photosensitive anti-reflective coating (ARC).

3. The device of claim 1, wherein the PAG layer comprises an organic bottom anti-reflective coating (BARC).

4. The device of claim 1, wherein the first pattern in the photoresist layer is formed using the acid to decompose a portion of the formed photoresist layer during a bake process.

5. The device of claim 1, further comprising: a feature formed on the substrate.

6. The device of claim 5, wherein the feature is a gate structure.

7. The device of claim 1, further comprising: a developer applied to the substrate including the decomposed portion of the formed photoresist layer and the exposed photoresist layer.

8. The device of claim 1, wherein the first pattern and the second pattern in the photoresist layer are formed as a single masking element.

9. The device of claim 8, further comprising: a gate electrode formed using the single masking element.

10. The device of claim 1, further comprising: an opening in the photoresist layer created from the decomposition of the portion of the photoresist layer.

11. A semiconductor device comprising:
a substrate;
a photo acid generating film formed on the substrate;
an overlying film decomposed using the photo acid generating film, thereby forming a first pattern in the overlying film; and
a second pattern formed on the overlying film, wherein the substrate is patterned according to the first pattern and the second pattern in a single process step using the overlying film as a masking element.

12. A method of forming semiconductor device, comprising:
providing a substrate;
forming a photo acid generator (PAG) layer on the substrate;
forming a first pattern in the PAG layer by irradiating the PAG layer through a first photomask;
forming a photoresist layer on the substrate; forming a second pattern in the photoresist layer by irradiating the photoresist layer through a second photomask, wherein the second photomask is different than the first photomask;
baking the substrate to generate an acid, wherein the acid decomposes a portion of the photoresist layer;
applying a developer solution to the substrate; and
forming a feature on the substrate using the first pattern and the second pattern as a masking element.

13. The method of claim 12, wherein the substrate is provided including a silicon crystalline structure material.

14. The method of claim 12, wherein the PAG layer is provided being an anti-reflective coating (ARC) layer, a bottom anti-reflective coating (BARC) layer or an organic BARC layer.

15. The method of claim 12, wherein irradiating the PAG layer includes exposing the PAG layer using ultra-violet (UV), deep UV, extreme UV, electron beam, ion beam lithography, and/or visible light radiation.

16. The method of claim 12, wherein the photoresist layer is formed including a positive or a negative type resist.

17. The method of claim 12, wherein the irradiating the photoresist layer includes exposing the photoresist layer using ultra-violet (UV), deep UV, extreme UV, and/or visible light radiation.

18. The method of claim 12, wherein baking the substrate includes exposing the substrate to a temperature less than 100 degrees Celsius.

19. The method of claim 12, wherein applying a developer solution to the substrate includes removing portions of the photoresist layer.

20. The method of claim 12, wherein forming a feature on the substrate includes forming gate structures, gate electrodes, conductive features, isolation features and/or doped regions.

* * * * *